US008217350B2

(12) United States Patent
Preikszas (10) Patent No.: US 8,217,350 B2
(45) Date of Patent: Jul. 10, 2012

(54) PARTICLE OPTICAL ARRANGEMENT (75) Inventor: Dirk Preikszas, Oberkochen (DE)

(73) Assignee: Carl Zeiss NTS GmbH, Oberkochen (DE)

(*) Notice: Subject to any disclaimer, the term of this patent is extended or adjusted under 35 U.S.C. 154(b) by 222 days.

(21) Appl. No.: 12/448,229

(22) PCT Filed: Nov. 23, 2007

(86) PCT No.: PCT/EP2007/010193
§ 371 (c)(1),
(2), (4) Date: Jun. 12, 2009

(87) PCT Pub. No.: WO2008/071303
PCT Pub. Date: Jun. 19, 2008

(65) Prior Publication Data
US 2009/0309025 A1  Dec. 17, 2009

(30) Foreign Application Priority Data
Dec. 14, 2006  (DE) .......... 10 2006 059 162

(51) Int. Cl.
*H01J 37/26* (2006.01)
*H01J 37/00* (2006.01)
(52) U.S. Cl. ........ 250/311; 250/306; 250/307; 250/309; 250/310
(58) Field of Classification Search .......... 250/306, 250/307, 309, 310, 311
See application file for complete search history.

(56) References Cited

U.S. PATENT DOCUMENTS

| | | | |
|---|---|---|---|
| 4,926,054 A | 5/1990 | Frosien | |
| 5,023,453 A | 6/1991 | Adachi et al. | |
| 6,452,173 B1 | 9/2002 | Oi | |
| 6,509,564 B1 | 1/2003 | Suzuki et al. | |
| 6,855,938 B2 | 2/2005 | Preikszas et al. | |
| 2004/0084629 A1 | 5/2004 | Preikszas et al. | |
| 2005/0184251 A1 | 8/2005 | Oi et al. | |
| 2006/0076489 A1 | 4/2006 | Ohshima et al. | |
| 2007/0262255 A1 | 11/2007 | Feuerbaum | |

FOREIGN PATENT DOCUMENTS

| | | |
|---|---|---|
| EP | 0762468 | 3/1997 |
| EP | 1557867 | 7/2005 |
| WO | WO 2008/071303 A2 | 6/2008 |
| WO | WO 2008/071303 A3 | 6/2008 |

OTHER PUBLICATIONS

PCT/ISA/237 "Schriftlicher Bescheid der Internationalel Recherchenbehorerde" (Written Opinion of the International Search Authority in International Application No. PCT/EP2007/010193, German language, 5 pages).

*Primary Examiner* — Michael Maskell
*Assistant Examiner* — Hanway Chang
(74) *Attorney, Agent, or Firm* — Bruce D Riter (57) ABSTRACT A particle optical arrangement providing an electron microscopy system 3 and an ion beam processing system 7 comprises an objective lens 43 of the electron microscopy system having an annular electrode 59 being a component of the electron microscopy system arranged closest to a position 11 of an object to be examined. Between the annular electrode and a principal axis 9 of the ion beam processing system 7 a shielding electrode 81 is arranged.

12 Claims, 6 Drawing Sheets

PARTICLE OPTICAL ARRANGEMENT

PRIORITY APPLICATION

This application is the United States national phase of International Application No. PCT/EP2007/010193 filed Nov. 23, 2007, the content of which is hereby incorporated by this reference, which in turn claims priority benefit of German Patent Application No. 10 2006 059 162.3, filed Dec. 14, 2006, the content of which is hereby incorporated by this reference.

The invention relates to a particle optical arrangement comprising an electron microscopy system and an ion beam processing system.

For manufacturing miniaturized structured elements there is demand to process a sample using an ion beam and to observe, substantially simultaneously with the processing, a progress of this processing using an electron microscope.

For this an apparatus may be employed which comprises a combined arrangement of an electron microscopy system for emitting a primary electron beam directed to an object to be examined along a principal axis of the electron microscopy system and an ion beam processing system for emitting an ion beam directed to the object to be examined along a principal axis of the ion beam processing system, wherein the principal axis of the electron microscopy system and the principal axis of the ion beam processing system are oriented relative to each other such that they enclose an angle so that both beams may be directed to a common region of an object to be examined and/or to be processed. Such systems are for example known from US 2005/0184251 A1 and from U.S. Pat. No. 6,855,938 whose disclosure is entirely incorporated into the present application.

Such a system may for example be employed to obtain information about a structure of structured elements manufactured in a semiconductor wafer. Using the ion beam for example a trench oriented perpendicular to a surface of the wafer may be cut into the wafer and using the electron microscope the progress of the processing by the ion beam may be tracked and also an electron microscopic image of a side face of the trench may be obtained to generate a cross sectional image of a manufactured semiconductor structure. During such a process the surface of the wafer is oriented substantially orthogonal to the direction of the ion beam, while the electron beam is oriented transverse to the surface of the wafer.

A high resolution electron microscopy system typically comprises an objective lens comprising for the focussing the electron beam a magnetic lens as well as an electrostatic lens. Herein electric fields of the electrostatic lens extend up to the sample to be examined. When for example a semiconductor wafer having a surface oriented transverse to a principal axis of the electron microscopy system is examined, the transverse arrangement of the wafer causes an influence of the electric field such that this field is, even for a rotationally symmetric construction of the electrostatic lens, not rotationally symmetric and the focussing and beam guidance of the electron beam is negatively influenced.

Further, the electric field leaking from the objective lens of the electron microscopy system also influences the beam guidance of the ion beam so that the ion beam is deflected from its desired path so that it does not impinge at a predetermined location at the sample.

It is an object of the present invention to propose a particle optical arrangement providing an electron microscopy system and an ion beam processing system with which a good focussing and beam guidance of the electron beam as well as a precise processing using the ion beam is enabled.

For solving this object a particle optical arrangement is proposed, comprising: An electron microscopy system for emitting a primary electron beam directed to an object to be examined along a principal axis of the electron microscopy system, and an ion beam processing system for emitting an ion beam directed to the object to be examined along a principal axis of the ion beam processing system, wherein the principal axis of the electron microscopy system and the principal axis of the ion beam processing system are oriented relative to each other enclosing an angle, wherein the electron microscopy system exhibits an objective lens which, for focussing the electron beam, comprises a magnetic lens and an electrostatic lens and which comprises an annular electrode traversed by the principal axis of the electron microscopy system, which annular electrode is the component of the electron microscopy system arranged closest to a position of the object to be examined, characterized by a shielding electrode arranged between the annular electrode and the principal axis of the ion beam processing system.

With such a particle optical arrangement it is possible to supply a voltage to the annular electrode of the electron microscopy system which, for a sample tilted relative to the principal axis of the electron microscopy system, influences the field escaping from the electrostatic lens such that this electrostatic field substantially maintains its rotationally symmetric configuration for focussing and beam guidance of the electron beam, while the shielding electrode substantially avoids an influence of the ion beam by the field of the annular electrode. It is thus enabled to achieve, compared to a conventional arrangement, an improved focussing and beam guidance of the electron beam, while the ion beam is simultaneously influenced to a low degree.

The shielding electrode may be located between the annular electrode and the principal axis of the ion beam processing system in the sense that at least one mathematical line orthogonal to the principal axis of the ion beam, processing system both intersects the shielding electrode as well as the annular electrode.

According to an embodiment of the invention, the shielding electrode is electroconductively connected to a portion of a housing of the ion beam processing system which portion is close to the object to be examined. Thus, the shielding electrode may for example be held at earth potential together with the housing of the ion beam processing system.

The shielding electrode may have the shape of a plate which is arranged between the annular electrode and the principal axis of the ion beam processing system. In particular, the shielding electrode may have a surface facing the principal axis of the ion beam processing system which surface is concavely bent. According to an embodiment, the shielding electrode may be bent such that it partially or entirely encompasses the principal axis of the ion beam processing system. In particular, the shielding electrode may be adapted as a sleeve traversed by the principal axis of the ion beam which sleeve in particular conically reduces in direction towards the position of the object to be examined.

According to an embodiment of the present invention it is provided that the shielding electrode exhibits a shape bent around the ion beam, wherein a front face of the shielding electrode facing the position of the object to be examined extends transversely to a mathematical surface orthogonal to the principal axis of the ion beam processing system. In particular it may be provided that the front face of the shielding electrode extends substantially parallel to a surface extending orthogonal to the principal axis of the electron microscopy system.

According to an embodiment of the invention also the annular electrode of the objective lens of the electron microscopy system may exhibit a shape conically reducing towards the position of the object to be examined.

According to an embodiment of the invention the particle optical arrangement comprises a voltage supply adapted to supply an electric voltage to the annular electrode. In particular, the electric voltage supplied to the annular electrode may serve to influence an electric field escaping from the objective lens such that this field is deformed to a preferably low extend by a surface arranged not orthogonal to the principal axis of the electron microscopy system and such that a configuration of the electric field close to a substantially rotationally symmetric shape is obtained. Thus, it may be advantageous to adjust the electric voltage supplied to the annular electrode depending on the orientation of the object to be examined relative to the principal axis of the electron microscopy system.

For a given working distance of the object to be examined from the end of the objective lens facing the position of the object and for a desired orientation of the object relative to the principal axis of the electron microscopy system it is thus possible to control the electric voltage supplied to the annular electrode such that the electric field escaping from the objective lens exhibits a substantially rotationally symmetric configuration and such that correspondingly a satisfactory focussing and beam guidance of the electron beam upon these conditions are achieved.

In some applications in praxis it is desired that the object to be examined is arranged substantially orthogonal to the principal axis of the ion beam processing system. Thus, also for this arrangement, an advantageous adjustment of the voltage supplied to the annular electrode may be found.

When the desired orientation of the object to be examined relative to the principal axis of the electron microscopy system is defined and when the, corresponding to this orientation, advantageous voltage for supply to the annular electrode is determined, according to an embodiment of the invention, the shielding electrode may have a particular geometry which is illustrated below. The distribution of the field escaping from the objective lens is considerably influenced by the geometry of the shielding electrode. According to the illustrated embodiment, the geometry of the shielding electrode is adjusted such that for the electric field along the principal axis of the ion beam processing system the following relation is satisfied:

$$\left| \frac{e}{2W_{kin}} \int_0^z E_\perp(z) \cdot z \cdot dz \right| < 10 \, \mu m,$$

In this integral the integration path extends on the principal axis of the ion beam processing system starting from the location of the object to be examined up to an inside of an ion optics of the ion beam processing system. The integration is performed over the component of the electric field which component is oriented perpendicular to the principal axis of the ion beam processing system, wherein this value is multiplied with the elementary charge e and weighted with the distance from the position of the object to be examined. When the value resulting from the integration is divided by twice the kinetic energy of the ions at the location of the object to be examined, a value of smaller than 10 µm, in particular smaller than 5 µm should result.

When the geometry of the shielding electrode is adapted such that the above relation is satisfied, an advantageous low influence of the ion beam by the electric field escaping from the objective lens of the electron microscopy system results.

Embodiments of the present invention are subsequently explained in more detail using figures. Herein FIG. 2b shows a detailed view of the FIG. 2a, FIG. 3a shows an extension of electric and magnetic fields in an objective lens as well as extensions of electron beams and ion beams in the particle optical arrangement according to FIG. 2a, however with changed voltage supply, FIG. 5b shows a detailed view of FIG. 5a, FIG. 6a shows a course of electric and magnetic fields in an objective lens as well as courses of electron beams and ion beams in the particle optical arrangement according to FIG. 5a, however with changed voltage supply, and FIG. 6b shows a detailed view of FIG. 6a.

Figure 1:
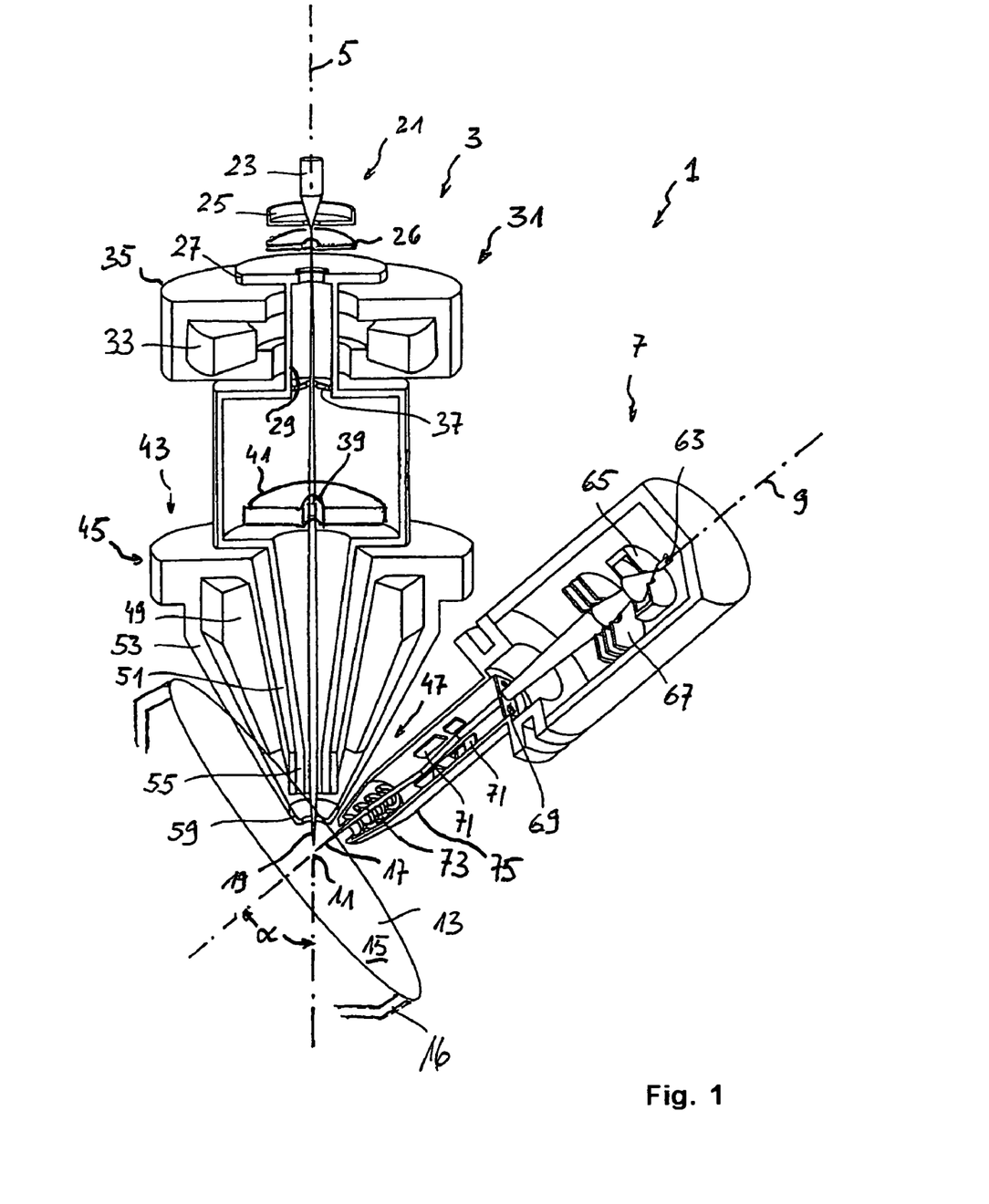
FIG. 1 shows a conventional particle optical arrangement comprising an electron microscopy system and an ion beam processing system.

FIG. 1 shows in a perspective and schematically simplified illustration a particle optical arrangement 1 according to the state of the art and for explaining embodiments of the present invention. The particle optical arrangement comprises an electron microscopy system 3 having a principal axis 5 and an ion beam processing system 7 having a principal axis 9. The principal axes 5 and 9 of the electron microscopy system 3 and the ion beam processing system 7, respectively, intersect at a location 11 enclosing an angle α which may amount to for example 45° to 55° so that an object 13 to be examined, such as a semiconductor wafer, having a surface 15 may, in a region of the location 11, be processed using an ion beam 17 emitted along the principal axis 9 of the ion beam processing system 7 and may also be examined using an electron beam 19 emitted along the principal axis 5 of the electron microscopy system 3. For holding the object, a schematically indicated holder 16 is provided which may adjust the object 13 with respect to a distance from and an orientation relative to the electron microscopy system.

The electron microscopy system 3 comprises for generating the primary electron beam 19 an electron source 21 which is schematically illustrated by a cathode 23 and an anode 27 as well as a suppressor electrode 25 arranged therebetween, and an extractor electrode 26 arranged spaced apart therefrom. The electron microscopy system 3 further comprises an acceleration electrode 27 merging into a beam tube 29 and traversing a collimator arrangement 31 schematically illustrated by an annular coil 33 and a yoke 35. After traversing the collimator arrangement 31 the primary electron beam traverses an aperture 37 and a central hole 39 in a secondary electron detector 41. The primary electron beam 19 then enters an objective lens 43 of the electron microscopy system 3. For focussing the primary electron beam 19 the objective lens 43 comprises a magnetic lens 45 and an electrostatic lens 47. In the schematic illustration of FIG. 1 the magnetic lens 45 comprises an annular coil 59, an inner pole piece 51 and an outer pole piece 53. The electrostatic lens 47 is formed by a lower end 55 of the beam tube 29, the inner lower end of the outer pole piece 53 and by an annular electrode 59 conically reducing towards the position 11 at the sample. The objective lens 43 schematically illustrated in FIG. 1 may exhibit a construction as illustrated in more detail in U.S. Pat. No. 6,855,938.

The ion beam processing system 7 comprises an ion source 63 having an extraction electrode 65, a collimator 67, a variable aperture 69, deflecting electrodes 71 and focussing lenses 73 for generating the ion beam 17 exiting from a housing 75 of the ion beam processing system 7.

Figure 2A:
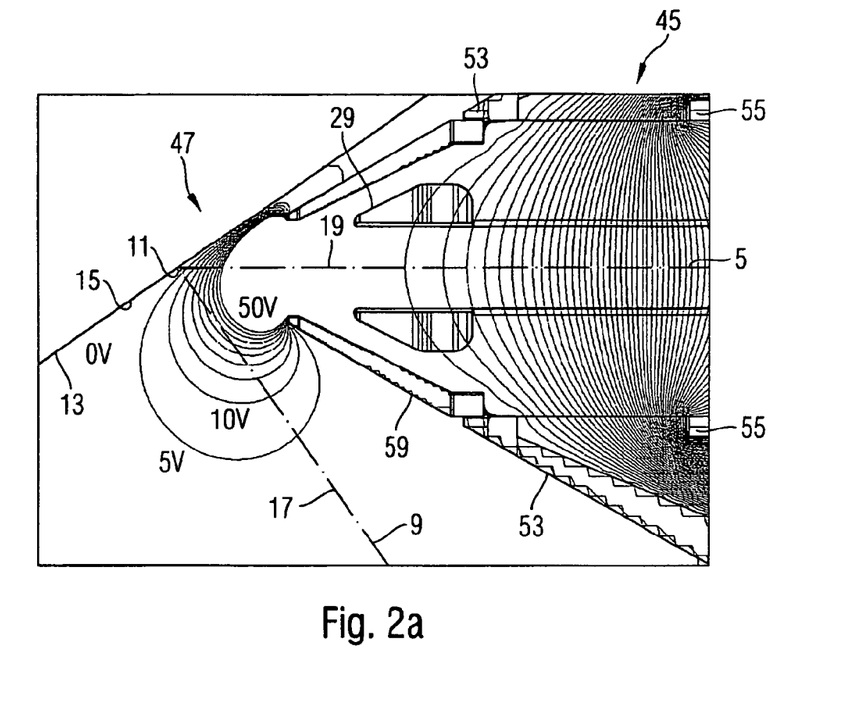
FIG. 2a shows an extension of electric and magnetic fields in an objective lens as well as extensions of electron beams and ion beams in a conventional particle optical arrangement.

FIG. 2a shows details of the electric lens 47 and the magnetic lens 45 of the objective lens 43 by illustrating magnetic and electric potential lines in a region of the objective lens 43 close to the location 11 where the principal axis 5 of the electron microscopy system 3 and the principal axis 9 of the ion beam processing system 7 intersect. FIG. 2a shows a lower end of the inner pole piece 55 as well as a lower inner end of the outer pole piece 53 which are arranged such that between the inner pole piece 55 and the outer pole piece 53 a pole piece gap is formed. This pole piece gap is permeated by magnetic potential lines which extend towards the principal axis 5 of the electron microscopy system to form a magnetic lens for the electron beam 19.

Figure 2B:
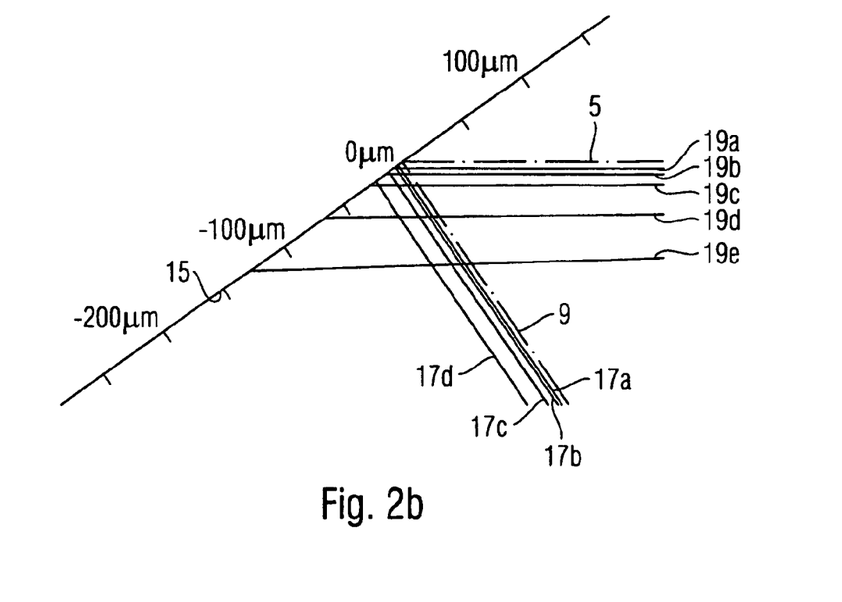

The electric lens 47 is formed by an electric field which is formed by a potential difference between the lower end of the beam tube 29 and the annular electrode 59. In the situation illustrated in FIG. 2a the annular electrode 59 together with the outer pole piece 53 and the surface 15 of the sample is held at ground potential, while the beam tube 29 is held at a potential of, for example, 8000 V. Due to the high field strength between the lower end of the beam tube 29 and the annular electrode 59 most potential lines of the electric field are not illustrated in FIG. 2a for clarity. In FIG. 2a merely the regions of the electric field escaping from the objective lens 43 are illustrated by potential lines for the potentials 50 V, 45 V, ..., 10 V and 5 V. From the extension of the potential line for 50 V it can be learned that, with respect to the principal axis 5 of the electron microscopy system, a rotational symmetry of the electric field escaping from the objective lens 43 is strongly impaired due to the tilting of the surface 15 of the sample which itself is held a potential of 0 V. This has adverse influences on the focussing and the beam guidance of the electron beam 19, in particular when the electron beam directed to the object 13 has low energies. This is shown in a magnified illustration around the region 11 according to FIG. 2b. In FIG. 2b lines 19a, 19b, 19c, 19d and 19e illustrate principal axes of the electron beam 19 for the energies 20 keV, 10 keV, 5 keV, 2 keV, and 1 keV, respectively. For decreasing kinetic energy of the electron beam the electron beam impinges with increasing distance from the intersection point of the principal axis 5 of the electron microscopy system with the surface 15 onto this surface 15 of the object 13. This distance may be read from the length scale shown in FIG. 2b, where the intersection point between the principal axis 5 and the surface 15 is located at 0 μm, the intersection point between the electron beam 19d for the energy 2 keV and the surface 15 is located at about −65 μm and the intersection point between the electron beam 19e for the energy 1 keV and the surface is located at about −130 μm.

Also the location of impingement of the ion beam 17 onto the surface 15 depends on the energy of the ion beam. FIG. 2b shows principal axes 17a, 17b, 17c and 17d of the ion beam 17 for the energies 30 keV, 20 keV, 10 keV, and 5 keV, respectively. The ion beam 17d for the energy 5 keV impinges at a distance of about −25 μm from the principal axis 9 of the ion beam processing system onto the surface 15 of the object.

Figure 3A:
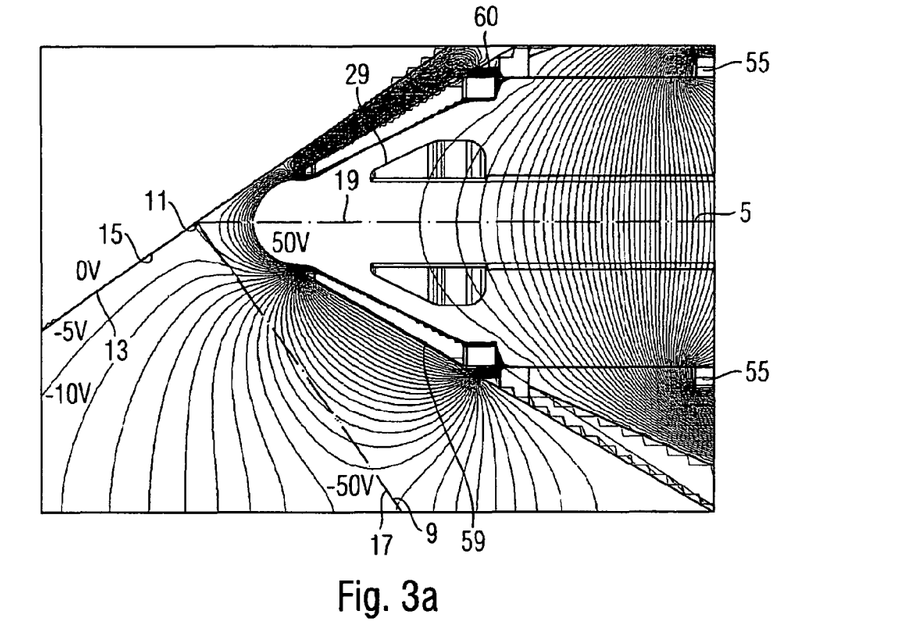
Figure 3B:
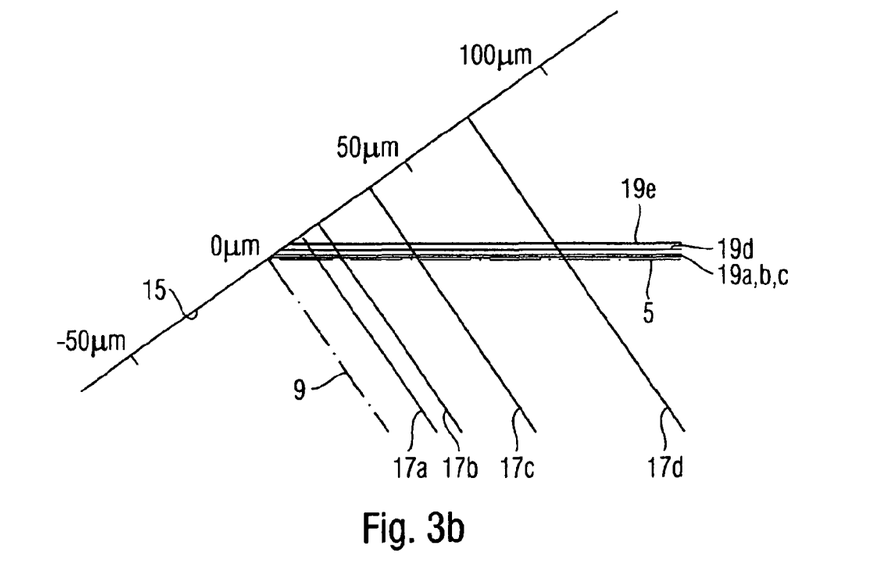
FIG. 3b shows a detailed view of FIG. 3a, FIG. 4 shows a detailed view of a particle optical arrangement according to an embodiment of the invention.

FIG. 3a shows a provision to reduce the asymmetry of the electric field escaping from the objective lens 43. According to FIG. 3a an electric voltage of −150 V is supplied to the annular electrode 59 from a voltage supply which is schematically shown as a block 60 and which causes a significant symmetrising the distribution of the electric field close to the sample as compared to the FIGS. 2a and 3a. This has an advantageous effect on the focussing and beam guidance of the electron beam as is obvious from the illustration of FIG. 3b corresponding to FIG. 2b. In FIG. 3b again electron beams 19a to 19e for the energies 20 keV, 10 keV, 5 keV, 2 keV, 1 keV, respectively, are indicated, wherein the beam 19e for the energy 1 keV impinges at a distance of less than 10 μm from the principal axis 5 of the electron microscopy system onto the surface 15 of the object 13.

Supplying the negative electric potential to the annular electrode 59 thus on one hand has the advantage of improving the focussing the electron beam 19, however on the other hand has the disadvantage of impairing the processing the object by the ion beam, since the location of impingement of the ion beam onto the surface 15 of the object 13 is now strongly energy dependent. In FIG. 3b again principal axes 17a to 17d for ion beams having energies 30 keV, 20 keV, 10 keV, and 5 keV, respectively, are illustrated, wherein the beam 17d for the energy 5 keV impinges with a distance of +75 μm from the principal axis 9 onto the surface 15.

According to an embodiment of the invention this disadvantage may largely be eliminated by arranging a suitable shielding electrode in a region close to the object such that this shielding electrode is arranged between the annular electrode 59 and the principal axis 9 of the ion beam processing system 7.

Figure 4:
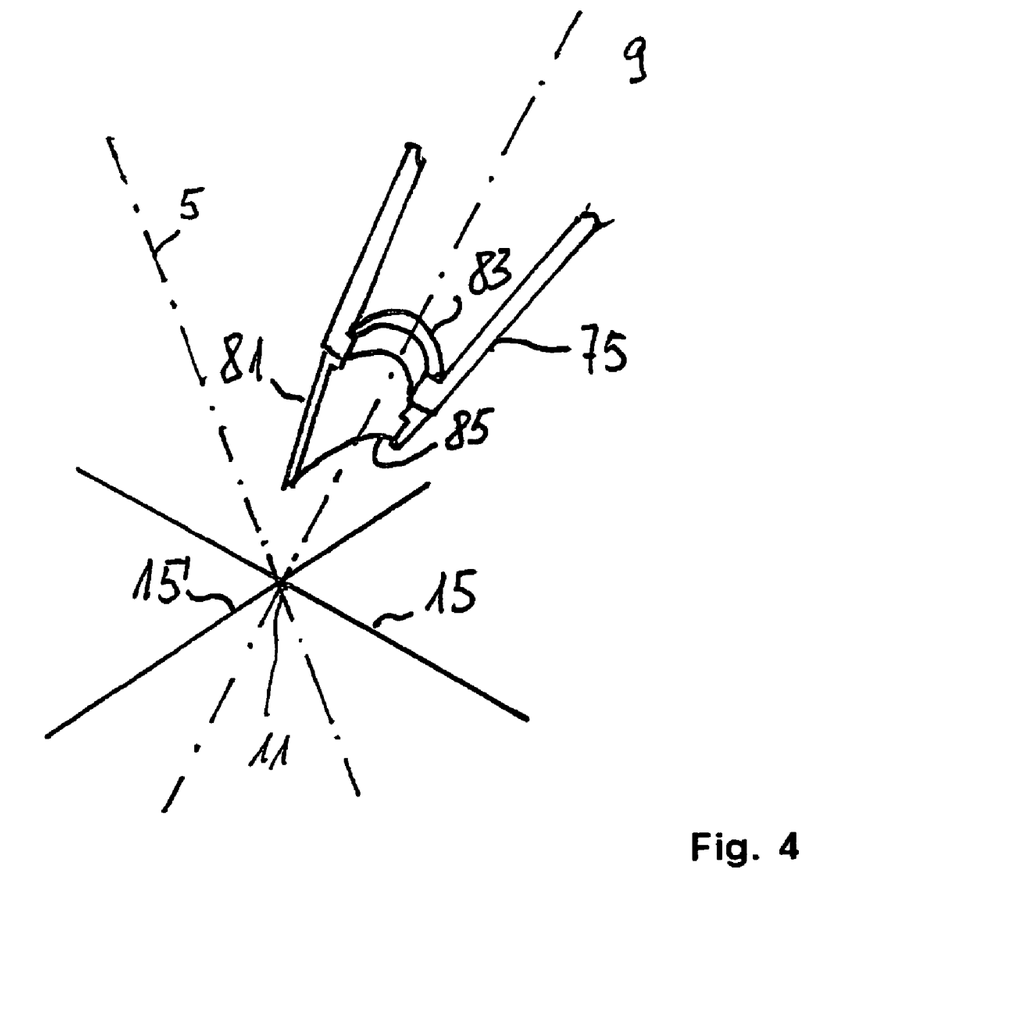

FIG. 4 shows an exemplary embodiment of such a shielding electrode 81 which is adapted as a sleeve conically reducing along the principal axis 9 of the ion beam processing system towards the object 15 which sleeve is fixed at a flange 83 of the housing 75 of the ion beam processing system 7. A front face 85 of the conical shielding electrode 81 which front face faces the object 15 is oriented transverse to the principal axis 9 of the ion beam processing system 7.

The line in FIG. 4 marked with reference No. 15 represents the sample surface in the orientation in which the sample surface is oriented orthogonal to the principal axis 9. The reference No. 15' represents the surface of the object in the orientation in which the surface of the object is arranged substantially orthogonal to the principal axis 5 of the electron microscopy system 3. In the embodiment illustrated in FIG. 4 the front face 85 of the shielding electrode 81 is oriented substantially parallel to the surface 15'.

Figure 5A:
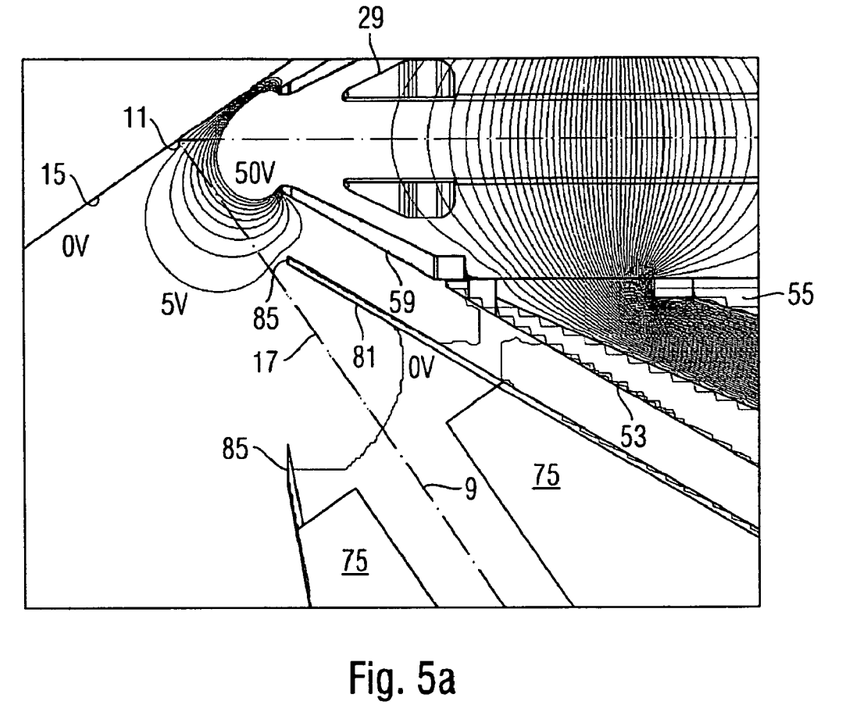
FIG. 5a shows an extension of electric and magnetic fields in an objective lens as well as extensions of electron beams and ion beams in a particle optical arrangement according to an embodiment of the invention.

FIG. 5a is an illustration corresponding to the one of FIG. 2a, wherein a potential of 0 V is supplied to the annular electrode 59 and wherein a relatively low influence of the shielding electrode 81 on the electric field is evident.

Figure 5B:
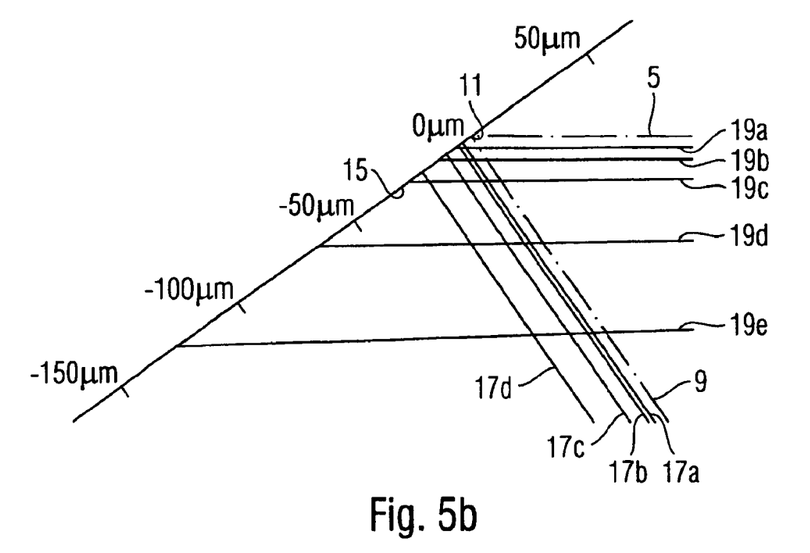

FIG. 5b is an illustration corresponding to the one of FIG. 2b, in which lines 19a to 19e illustrate principal axes of the electron beam for the energies 20 keV, 10 keV, 5 keV, 2 keV and 1 keV, respectively, and wherein lines 17a to 17d represent principal axes of the ion beam for the energies 30 keV, 20 keV, 10 keV and 5 keV, respectively. Similar as in FIG. 2b the electron beam 19e for the energy 1 keV impinges at a distance of −130 μm from the principal axis 5 of the electron microscopy system onto the surface 15 of the object. Similarly, the ion beam 17b having the energy 5 keV impinges at a distance of about −25 μm from the principal axis 9 of the ion beam processing system onto the surface 15 of the object.

Figure 6A:
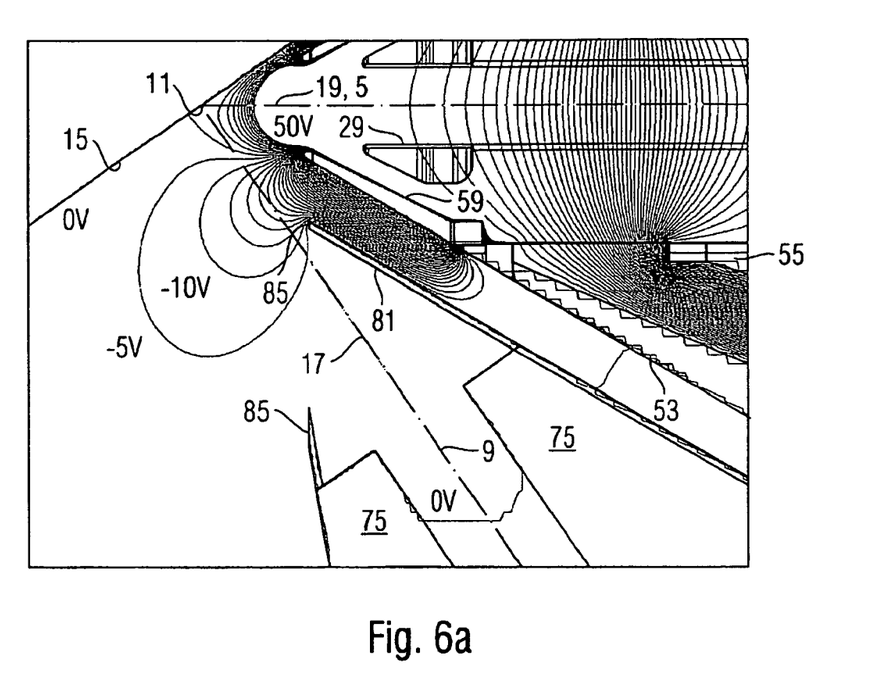
Figure 6B:
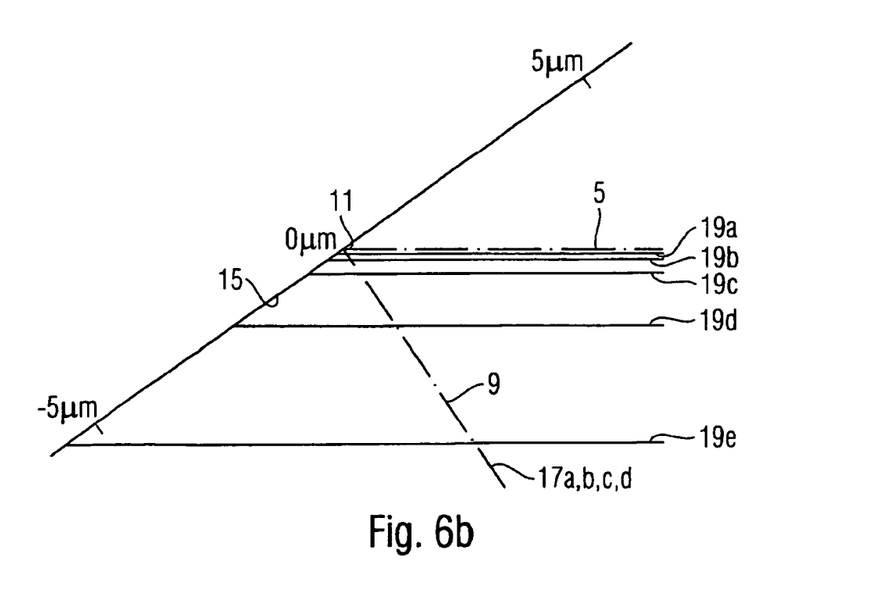

FIG. 6a is an illustration corresponding to the one of FIG. 3a, in which again an electric potential of −150 V is supplied to the annular electrode 59 for symmetrising the electric field for the focussing and beam guidance of the electron beam. From FIG. 6a a significant influence of the shielding electrode 81 on the distribution of the electric field is evident. This influence of the shielding electrode 81 allows a good focussing and beam guidance both of the electron beam 19 and also the ion beam 17, as is evident from the illustration according to FIG. 6b corresponding to the one of FIG. 3b. In FIG. 6b the lines 19a to 19e again represent principal axes of the electron beam for the energies 20 keV, 10 keV, 5 keV, 2 keV and 1 keV, respectively. The electron beam 19e impinges at a distance of −5.7 μm from the principal axis 5 of the electron microscopy system onto the surface 15 of the object which represents a relatively good result compared to FIG. 2b. Due to the especially chosen geometry for the shielding electrode 81 which is subsequently explained principal axes 17a to 17d of the ion beam for the energies 30 keV, 20 keV, 10 keV and 5 keV, respectively, virtually coincide and intersect the surface 15 of the object 13 together with the principal axis 9 of the ion beam processing system and together with the principal axis 5 of the electron microscopy system. The location of impingement of the ion beam 17 thus is substantially independent of the energy of the ion beam. This is a very good result compared to the FIGS. 2b and 3b.

The lack of a substantial energy dependence of the location of impingement of the ion beam onto the surface 15 of the object 13 is due to the special choice of the geometry of the shielding electrode 81. As is evident from FIG. 6a the ion beam traverses on its path out of the housing 75 of the ion optics and towards the surface 15 of the object 13 first a region in which a component of the electric field oriented transverse to the axis 9 is directed in the illustration of FIG. 6a to the right hand side and then a region in which this component of the electric field is directed to the left hand side. This causes a deflection of the ion beam first to the right hand side and then shortly before the impingement onto the surface 15 to the left hand side. The geometry of the shielding electrode is dimensioned such that these deflections to the right hand side and to the left hand side compensate to zero. This is the case, if the following relation is satisfied:

$$\left| \frac{e}{2W_{kin}} \int_0^z E_\perp(z) \cdot z \cdot dz \right| < 10 \, \mu m,$$

which has already been explained above.

A particle optical arrangement according to an embodiment of the present invention thus basically exhibits a construction as has previously been explained referring to FIG. 1, wherein however a shielding electrode is additionally arranged between the annular electrode of the objective lens of the electron microscopy system and the principal axis of the ion beam processing system. The shielding electrode may for example exhibit a construction, as has been explained with respect to FIG. 4. However, the shielding electrode is not necessarily adapted as a sleeve and does not necessarily encompass the principal axis 9 of the ion beam processing system, but may also exhibit a shape different therefrom. The shielding electrode may for example also be adapted as a substantially plane plate which is arranged between the annular electrode of the objective lens and the principal axis of the ion beam processing system.

As illustrated in FIG. 1, the ion beam processing system comprises a beam deflector 71 to deflect the ion beam from the principal axis 9 of the ion beam processing system 7 so that the ion beam 17 may impinge on locations at the surface 15 of the object 13 which are different from the intersection point 11 of the principal axis 9 of the ion beam processing system 7 and the surface 15. In FIGS. 2, 3, 5 and 6 however ion beams are respectively denoted by reference signs 17a to 17d which are not shifted by controlling the beam deflector from the principal axis 9, but are merely deflected from the principal axis 9 due to the effect of the field escaping from the objective lens of the electron microscopy system.

Similarly, the electron microscopy system comprises beam deflectors for the electron beam which are typically arranged inside the objective lens and which are not illustrated in FIG. 1. Using these beam deflectors the electron beam is scanned across the surface of the object to be examined to obtain a scanning electron microscopic recording of the object. In the illustrations of FIGS. 2, 3, 5 and 6 the reference signs 19a to 19e however denote electron beams which are not deflected from the principal axis 5 of the electron microscopy system by controlling beam deflectors but merely due to the effect of the electric field escaping from the objective lens.

In the afore described embodiments the shielding electrode 81 is electroconductively connected to the housing 75 of the ion beam processing system and thus is held in most applications at earth potential.

However, it is also possible to supply an electric potential using a voltage supply provided therefore which electric potential is different from the earth potential. It may also be meaningful to electrically isolate the shielding electrode from the housing of the ion beam processing system. By supplying such a voltage to the shielding electrode the electric field in front of the object to be examined may be influenced and in particular may be further optimised with respect to the beam guidance of the electron beam and the ion beam. This may in particular be exploited, when for particular angles α it is not possible by choice of the geometry of the shielding electrode to satisfy the relation defined by the above given formula. In particular it is possible by changing the voltage supplied to the shielding electrode to satisfy the relation determined by the above given formula for plural different orientations α of the object relative to the beam axes.

Summarized a particle optical arrangement providing an electron microscopy system and an ion beam processing system comprises an objective lens of the electron microscopy system exhibiting an annular electrode which annular electrode is a component of the electron microscopy system arranged closest to a position of a object to be examined. Between the annular electrode and a principal axis of the ion beam processing system a shielding electrode is arranged.

The invention claimed is:
1. A particle optical arrangement, comprising:
 an electron microscopy system for emitting a primary electron beam directed to an object to be examined along a principal axis of the electron microscopy system, and
 an ion beam processing system for emitting an ion beam directed to the object to be examined along a principal axis of the ion beam processing system, wherein the principal axis of the electron microscopy system and the principal axis of the ion beam processing system are oriented relative to each other such that they enclose an angle,
 wherein the electron microscopy system comprises an objective lens comprising, for focussing the electron beam, a magnetic lens and an electrostatic lens and comprising an annular electrode traversed by the principal axis of the electron microscopy system,
wherein the annular electrode is the component of the electron microscopy system arranged closest to a position of the object to be examined,
wherein a shielding electrode is arranged between the annular electrode and the principal axis of the ion beam processing system, and
wherein the shielding electrode comprises a conical sleeve with a truncation surface defining a front face facing the position of the object to be examined which front face extends transversely to a mathematical surface orthogonal to the principal axis of the ion beam processing system.

2. The particle optical arrangement according to claim 1, wherein the shielding electrode is arranged such that at least one mathematical line orthogonal to the principal axis of the ion beam processing system intersects both the shielding electrode and the annular electrode.

3. The particle optical arrangement according to claim 1, wherein the shielding electrode is electroconductively connected to a portion of a housing of the ion beam processing system which portion is arranged closest to the position of the object to be examined.

4. The particle optical arrangement according to claim 1, further comprising a voltage supply for supplying an electric voltage to the shielding electrode.

5. The particle optical arrangement according to claim 1, wherein a surface of the shielding electrode facing the principal axis of the ion beam processing system is concavely bent.

6. The particle optical arrangement according to claim 5, wherein the shielding electrode is adapted as a sleeve at least partially encompassing the principal axis of the ion beam processing system.

7. The particle optical arrangement according to claim 6, wherein the sleeve conically reduces towards the position of the object to be examined.

8. The particle optical arrangement according to claim 1, wherein the front face of the shielding electrode extends substantially parallel to a mathematical surface orthogonal to the principal axis of the electron microscopy system.

9. The particle optical arrangement according to claim 1, wherein the annular electrode conically reduces towards the position of the object to be examined.

10. The particle optical arrangement according to claim 1, further comprising a voltage supply for supplying an electric voltage to the annular electrode.

11. A particle optical arrangement, comprising:
an electron microscopy system for emitting a primary electron beam directed to an object to be examined along a principal axis of the electron microscopy system,
an ion beam processing system for emitting an ion beam directed to the object to be examined along a principal axis of the ion beam processing system, wherein the principal axis of the electron microscopy system and the principal axis of the ion beam processing system are oriented relative to each other such that they enclose an angle,
wherein the electron microscopy system comprises an objective lens comprising, for focussing the electron beam, a magnetic lens and an electrostatic lens and comprising an annular electrode traversed by the principal axis of the electron microscopy system, wherein the annular electrode is the component of the electron microscopy system arranged closest to a position of the object to be examined, and wherein a shielding electrode is arranged between the annular electrode and the principal axis of the ion beam processing system,
an object holder adapted to hold the object to be examined in at least two different orientations of a surface of the object relative to the principal axis of the electron microscopy system, and
a voltage supply for supplying an electric voltage to the annular electrode, wherein the voltage supplied from the voltage supply to the annular electrode during operation of the particle optical arrangement amounts to different values for different orientations of the surface of the object relative to the principal axis of the electron microscopy system,
wherein the shielding electrode is configured such that for an orientation of the surface of the object substantially orthogonal to the principal axis of the ion beam processing system and for a corresponding adjustment of the voltage supplied to the annular electrode during the operation a distribution of an electric field along the principal axis of the ion beam processing system is established such that the following relation is satisfied:

$$\left| \frac{e}{2W_{kin}} \int_0^Z E_\perp(z) \cdot z \cdot dz \right| < 10\,\mu m,$$

wherein
e represents the elementary charge,
z represents the distance from the surface of the object along the principal axis of the ion beam processing system,
$E_\perp(z)$ represents the component of the electric field perpendicular to the principal axis of the ion beam processing system at a location arranged a distance z apart from the surface of the object along the principal axis,
Z represents a distance along the principal axis of the ion beam processing system to a location arranged within an ion optics of the ion beam processing system, and
$W_{kin}$ represents a kinetic energy of the ions of the ion beam at the location of the object.

12. A particle optical arrangement, comprising:
an electron microscopy system for emitting a primary electron beam directed to an object to be examined along a principal axis of the electron microscopy system, and
an ion beam processing system for emitting an ion beam directed to the object to be examined along a principal axis of the ion beam processing system, wherein the principal axis of the electron microscopy system and the principal axis of the ion beam processing system are oriented relative to each other such that they enclose an angle,
wherein the electron microscopy system comprises an objective lens comprising, for focussing the electron beam, a magnetic lens and an electrostatic lens and comprising an annular electrode traversed by the principal axis of the electron microscopy system, wherein the annular electrode is the component of the electron microscopy system arranged closest to a position of the object to be examined, and wherein a shielding electrode is arranged between the annular electrode and the principal axis of the ion beam processing system; and
wherein the shielding electrode is configured such that that the following relation is satisfied during an operation of the particle optical arrangement in which an orientation of a surface of the object is substantially orthogonal to the principal axis of the ion beam processing system:

$$\left| \frac{e}{2W_{kin}} \int_0^Z E_\perp(z) \cdot z \cdot dz \right| < 10 \ \mu m,$$

wherein
e represents the elementary charge,
z represents the distance from the surface of the object along the principal axis of the ion beam processing system,
$E_\perp(z)$ represents a component of an electric field perpendicular to the principal axis of the ion beam processing system at a location arranged a distance z apart from the surface of the object along the principal axis, z represents a distance along the principal axis of the ion beam processing system to a location arranged within an ion optics of the ion beam processing system, and $W_{kin}$ represents a kinetic energy of the ions of the ion beam at the location of the object.

* * * * *